United States Patent
Lai et al.

(10) Patent No.: US 11,894,487 B2
(45) Date of Patent: Feb. 6, 2024

(54) LIGHT EMITTING DEVICE

(71) Applicant: EPISTAR CORPORATION, Hsinchu (TW)

(72) Inventors: Shih-Kuo Lai, Hsinchu (TW); Li-Shen Tang, Hsinchu (TW)

(73) Assignee: EPISTAR CORPORATION, Hsinchu (TW)

(*) Notice: Subject to any disclaimer, the term of this patent is extended or adjusted under 35 U.S.C. 154(b) by 311 days.

(21) Appl. No.: 17/349,484

(22) Filed: Jun. 16, 2021

(65) Prior Publication Data

US 2021/0399170 A1 Dec. 23, 2021

(30) Foreign Application Priority Data

Jun. 17, 2020 (CN) .......................... 202010552107.2

(51) Int. Cl.
*H01L 33/20* (2010.01)
*H01L 33/00* (2010.01)
*H01L 33/32* (2010.01)

(52) U.S. Cl.
CPC .......... *H01L 33/20* (2013.01); *H01L 33/0093* (2020.05); *H01L 33/32* (2013.01)

(58) Field of Classification Search
CPC ..... H01L 33/0093; H01L 33/20; H01L 33/32; H01L 33/12; H01L 2933/0083
See application file for complete search history.

(56) References Cited

U.S. PATENT DOCUMENTS

| | | | | |
|---|---|---|---|---|
| 6,617,182 | B2* | 9/2003 | Ishida | H01L 21/0254 |
| | | | | 257/E21.127 |
| 6,627,520 | B2* | 9/2003 | Kozaki | H01L 21/0242 |
| | | | | 438/479 |
| 11,211,527 | B2* | 12/2021 | Wildeson | H01L 21/02639 |
| 11,282,982 | B2* | 3/2022 | Chang | H01L 33/10 |
| 2008/0281385 | A1* | 11/2008 | Inada | B82Y 20/00 |
| | | | | 607/94 |
| 2011/0101404 | A1* | 5/2011 | Fu | H01L 33/22 |
| | | | | 257/E33.07 |
| 2012/0068214 | A1* | 3/2012 | Kuo | H01L 33/007 |
| | | | | 257/E33.068 |

* cited by examiner

*Primary Examiner* — Savitri Mulpuri
(74) *Attorney, Agent, or Firm* — DITTHAVONG, STEINER & MLOTKOWSKI

(57) ABSTRACT

A light-emitting device comprises a substrate; a first semiconductor layer formed on the substrate; a first patterned layer formed on the first semiconductor layer; and a second semiconductor layer formed on the first semiconductor layer, wherein the second semiconductor layer comprises a core layer comprising a group III or transition metal material formed along the first patterned layer.

18 Claims, 10 Drawing Sheets

3b

3c

LIGHT EMITTING DEVICE

TECHNICAL FIELD

The application relates to a light-emitting device, and more particularly, to a light-emitting device comprising a patterned layer formed on a semiconductor layer.

REFERENCE TO RELATED APPLICATION

This application claims the right of priority based on CN Application Serial No. 202010552107.2, filed on Jun. 17, 2020, and the content of which is hereby incorporated by reference in its entirety.

DESCRIPTION OF BACKGROUND ART

Light-Emitting Diode (LED) is a solid-state semiconductor light-emitting device, which has the advantages of low power consumption, low heat generation, long working lifetime, shockproof, small volume, fast reaction speed and good photoelectric property, such as stable emission wavelength. Therefore, the light-emitting diodes are widely used in the household appliances, the equipment indicators, and the optoelectronic products.

SUMMARY OF THE APPLICATION

A light-emitting device comprises a substrate; a first semiconductor layer formed on the substrate; a first patterned layer formed on the first semiconductor layer; and a second semiconductor layer formed on the first semiconductor layer, wherein the second semiconductor layer comprises a core layer comprising a group III element or transition metal material formed along the first patterned layer.

DETAILED DESCRIPTION OF PREFERRED EMBODIMENTS

Figure 1:
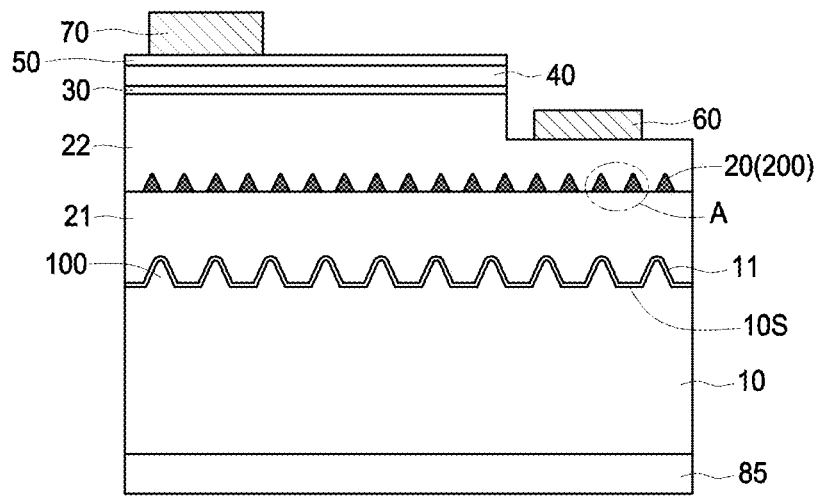
FIG. 1 illustrates a side view of a light-emitting device 1 in accordance with an embodiment of the present application.

The embodiment of the application is illustrated in detail, and is plotted in the drawings. The same or the similar part is illustrated in the drawings and the specification with the same number.

FIG. 1 illustrates a side view of a light-emitting device 1 in accordance with an embodiment of the present application. As shown in FIG. 1, the light-emitting device 1 comprises a substrate 10; a first semiconductor layer 21 formed on the substrate 10; a first patterned layer 20 formed on the first semiconductor layer 21; a second semiconductor layer 22 formed on the first semiconductor layer 21 and covering the first patterned layer 20; an active layer 30 formed on the second semiconductor layer 22; a third semiconductor layer 40 formed on the active layer 30; a first electrode 60 formed on the second semiconductor layer 22; and a second electrode 70 formed on the third semiconductor layer 40.

The substrate 10 can be a growth substrate for the epitaxial growth of the first semiconductor layer 21. The substrate 10 comprises gallium arsenide (GaAs) wafer for epitaxially growing aluminum gallium indium phosphide (AlGaInP), or sapphire ($Al_2O_3$) wafer, gallium nitride (GaN) wafer, silicon carbide (SiC) wafer, or aluminum nitride (AlN) wafer for epitaxially growing gallium nitride series materials, such as gallium nitride (GaN), indium gallium nitride (InGaN), or aluminum gallium nitride (AlGaN).

In an embodiment of the present application, the top surface 10S of the substrate 10 connecting the first semiconductor layer 21 can be a flat or roughened surface. The roughened surface comprises a surface with an irregular morphology or a surface with a regular morphology. Specifically, with respect to the top surface 10S, the substrate 10 comprises one or a plurality of convex portions 100 protruding from the top surface 10S, or comprises one or a plurality of concave portions (not shown) recessed in the top surface 10S, the convex portion 100 or the concave portion can be hemispherical, cone, or polygonal cone. From a top view, the convex portion 100 or the concave portion can be circular or polygonal. From a side view, the convex portion 100 or the concave portion can be semicircular, triangular, or polygonal.

In an embodiment of the present application, the light-emitting device 1 further comprise a buffer layer 11 formed between the first semiconductor layer 21 and the substrate 10 to release the stress caused by the lattice mismatch between the substrate 10 and the first semiconductor layer 21 and to reduce the misalignment and the lattice defects, thereby improving the quality of epitaxial crystals. The buffer layer 11 can be a single layer or a structure comprising multiple sub-layers. When growing a semiconductor layer comprising gallium nitride material, the buffer layer 11 comprises silicon nitride ($SiN_x$), gallium nitride (GaN), aluminum nitride (AlN), aluminum gallium nitride (AlGaN), indium gallium nitride (InGaN), aluminum indium nitride (AlInN), indium nitride (InN), aluminum indium gallium nitride (AlInGaN), or a combination of the above materials. For example, physical vapor deposition (PVD) aluminum nitride (AlN) can serve as a buffer layer, which is formed between the first semiconductor layer 21 and the substrate 10 to improve the epitaxial quality of the first semiconductor layer 21, the second semiconductor layer 22, the active layer 30, and the third semiconductor layer 40. In an embodiment, the target material used to form PVD aluminum nitride (AlN) is composed of aluminum nitride. In another embodiment, a target made of aluminum is used, and the aluminum nitride is reactively formed by the aluminum target in an environment of a nitrogen source. When growing a semiconductor layer comprising a gallium arsenide material, the buffer layer 11 comprises gallium arsenide (GaAs), aluminum gallium arsenide (AlGaAs), aluminum gallium indium arsenide (AlGaInAs), indium gallium arsenide (InGaAs), Indium gallium phosphide (InGaP), indium gallium arsenide phosphorous (InGaAsP), gallium phosphide (GaP), indium phosphide (InP), or a combination of the above materials.

In an embodiment of the present application, the metal organic chemical vapor deposition (MOCVD), molecular beam epitaxy (MBE), hydride vapor phase epitaxy (HVPE), physical vapor deposition (PVD), or ion plating method is provided to form the first semiconductor layer 21, the second semiconductor layer 22, the third semiconductor layer 40, and the active layer 30 with optoelectronic properties, such as a light-emitting stack, wherein the physical vapor deposition method comprises sputtering or evaporation.

The materials of the first semiconductor layer 21, the second semiconductor layer 22, the third semiconductor layer 40, and the active layer 30 comprise group III-V semiconductor materials, such as $Al_xIn_yGa_{(1-x-y)}N$ or $Al_{x^-}In_yGa_{(1-x-y)}P$, wherein 0≤x, y≤1; (x+y)≤1. By changing the physical and chemical compositions of the active layer 30, the wavelength of the light emitted from the light-emitting device 1 can be adjusted. When the active layer 30 comprises AlInGaP series material, the red light having a wavelength between 610 nm and 650 nm or the green light having a wavelength between 550 nm and 570 nm can be emitted. When the active layer 30 comprises InGaN series material, the blue or deep blue light having a wavelength between 400 nm and 490 nm or the green light having a wavelength between 490 nm and 550 nm can be emitted. When the active layer 30 comprises AlGaN series or AlInGaN series material, the ultraviolet light having a wavelength between 250 nm and 400 nm can be emitted.

An undoped semiconductor layer (not shown) and/or an n-type doped semiconductor layer (not shown) can be formed between the first semiconductor layer 21 and the buffer layer 11, or can be formed between the second semiconductor layer 22 and the active layer 30. The material of the undoped semiconductor layer and the n-type doped semiconductor layer comprises gallium nitride (GaN), aluminum nitride (AlN), aluminum gallium nitride (AlGaN), indium gallium nitride (InGaN), aluminum indium nitride (AlInN), indium nitride (InN), or aluminum indium gallium nitride (AlInGaN).

The first semiconductor layer 21 can be a doped or undoped semiconductor layer. The second semiconductor layer 22 and the third semiconductor layer 40 can be confinement layers, which have different conductivity types, electrical properties, polarities, or doping elements for providing electrons or holes. When the first semiconductor layer 21 and/or the second semiconductor layer 22 are doped semiconductor layers, the material of the first semiconductor layer 21 and/or the second semiconductor layer 22 is a semiconductor comprising a first conductivity type dopant, for example, n-type conductivity semiconductor. The first conductivity type dopant comprises silicon (Si), germanium (Ge), tin (Sn), selenium (Se), or antimony (Sb). The material of the third semiconductor layer 40 is a semiconductor comprising a second conductivity type dopant, for example, p-type conductivity semiconductor. The active layer 30 is formed between the second semiconductor layer 22 and the third semiconductor layer 40. The electrons and the holes combine in the active layer 30 under a driving current to convert the electrical energy into the light energy to emit a light. The active layer 30 can be a single heterostructure (SH), a double heterostructure (DH), a double-side double heterostructure (DDH), or a multi-quantum well structure (MQW). The material of the active layer 30 can be i-type, p-type, or n-type semiconductor. The first semiconductor layer 21, the second semiconductor layer 22, the third semiconductor layer 40, and the active layer 30 can be a single layer or a structure comprising a plurality of sub-layers.

The first semiconductor layer 21, the second semiconductor layer 22, and the third semiconductor layer 40 comprise the same or different materials. For example, the first semiconductor layer 21 can be one of gallium nitride (GaN), aluminum nitride (AlN), aluminum gallium nitride (AlGaN), indium gallium nitride (InGaN), aluminum indium nitride (AlInN), indium nitride (InN) and aluminum indium gallium nitride (AlInGaN). The second semiconductor layer 22 and the third semiconductor layer 40 can be one of gallium nitride (GaN), aluminum nitride (AlN), aluminum gallium nitride (AlGaN), indium gallium nitride (InGaN), aluminum indium nitride (AlInN), Indium nitride (InN), aluminum indium gallium nitride (AlInGaN), gallium arsenide (GaAs), aluminum gallium arsenide (AlGaAs), aluminum gallium indium arsenide (AlGaInAs), indium gallium arsenide (InGaAs), indium gallium phosphide (InGaP), indium gallium arsenide phosphide (InGaAsP), gallium phosphide (GaP), and indium phosphide (InP). In an embodiment, the first semiconductor layer 21 of the light-emitting device 1 is formed of the aforementioned group III nitride, and the second semiconductor layer 22, the active layer 30, and the third semiconductor layer 40 are formed of the aforementioned group III phosphide or group III arsenide.

In an embodiment, the second semiconductor layer 22 comprises aluminum, and the first semiconductor layer 21 does not comprise aluminum. For example, the second semiconductor layer 22 is formed of aluminum gallium nitride (AlGaN), and the first semiconductor layer 21 is formed of gallium nitride (GaN). As an embodiment of the present application, the first semiconductor layer 21 and the second semiconductor layer 22 both comprise aluminum, and the aluminum content of the second semiconductor layer 22 is equal to, greater than, or less than the aluminum content of the first semiconductor layer 21.

If the first semiconductor layer 21 comprises gallium nitride (GaN), one of the growth conditions of the first semiconductor layer 21 comprises providing trimethylgallium (TMGa), or triethylgallium (TEGa) as gallium (Ga) source gas, and providing ammonia ($NH_3$), monomethylamine (MMH), or dimethylamine (DMH) as nitrogen (N) source gas. If the first semiconductor layer 21 and/or the second semiconductor layer 22 comprises aluminum gallium nitride (AlGaN), one of the growth conditions of the first semiconductor layer 21 and/or the second semiconductor layer 22 comprises providing trimethyl aluminum (TMAl) or triethyl aluminum (TEAl) as aluminum (Al) source gas, trimethylgallium (TMGa) or triethyl gallium (TEGa) as gallium (Ga) source gas, and ammonia ($NH_3$), monomethylamine (MMH) or dimethylamine (DMH) as nitrogen (N) source gas. If the second semiconductor layer 22 comprises gallium arsenide (GaAs), one of the growth conditions of the second semiconductor layer 22 comprises providing trimethylgallium (TMGa) or triethylgallium (TEGa) as gallium (Ga) source gas, and arsine hydrogen ($AsH_3$) as arsenic (As) source gas.

As shown in FIG. 1, the first electrode 60 and the second electrode 70 are formed on the same side of the substrate 10. The light-emitting device 1 can be designed as a flip chip structure or a lateral chip structure for different downstream package applications.

In the embodiment, the second semiconductor layer 22 is exposed by removing a part of the second semiconductor layer 22, the third semiconductor layer 40, and the active layer 30. The first electrode 60 is formed on the second semiconductor layer 22 and is electrically connected to the second semiconductor layer 22. The second electrode 70 is formed on the third semiconductor layer 40 and is electrically connected to the third semiconductor layer 40.

The first electrode 60 and the second electrode 70 comprise metal materials, such as chromium (Cr), titanium (Ti), tungsten (W), gold (Au), aluminum (Al), indium (In), tin (Sn), nickel (Ni), platinum (Pt), or an alloy of the above materials. The first electrode 60 and the second electrode 70 comprise single layer or multiple layers. For example, the first electrode 60 or the second electrode 70 comprises Ti/Au layers, Ti/Pt/Au layers, Cr/Au layers, Cr/Pt/Au layers, Ni/Au layers, Ni/Pt/Au layers, or Cr/Al/Cr/Ni/Au layers. The first electrode 60 and the second electrode 70 can be used as a current path for an external power source to supply current to the second semiconductor layer 22 and the third semiconductor layer 40. The first electrode 60 and/or the second electrode 70 comprises a thickness between 1~100 µm, preferably between 1.2~60 µm, and more preferably between 1.5~6 µm.

In an embodiment of the present application, in order to reduce the contact resistance and improve the current spreading efficiency, the light-emitting device 1 comprises a conductive layer 50 formed between the third semiconductor layer 40 and the second electrode 70. The conductive layer 50 comprises a material that is transparent to the light emitted from the active layer 30, such as a metal material with a thickness smaller than 500 Å or a transparent conductive oxide. The transparent conductive oxide comprises indium tin oxide (ITO) or indium zinc oxide (IZO).

In an embodiment of the present application, the light-emitting device 1 comprises one or a plurality of current blocking layers (not shown) formed between the third semiconductor layer 40 and the conductive layer 50 and formed under the second electrode 70. The current blocking layer is formed of non-conductive materials comprising aluminum oxide ($Al_2O_3$), silicon nitride ($SiN_x$), silicon oxide ($SiO_x$), titanium oxide ($TiO_x$), or magnesium fluoride ($MgF_x$). The current blocking layer comprises a Distributed Bragg Reflector (DBR), wherein the Distributed Bragg Reflector comprises insulating materials with different refractive indexes stacked alternately. The current blocking layer has a light transmittance of more than 80% or a light reflectance of more than 80% for the light emitted from the active layer 30.

In order to increase the light-emitting efficiency of the light-emitting device 1, in an embodiment of the present application, the light-emitting device 1 comprises a reflective structure 85 formed under the substrate 10 to reflect the light from the active layer 30. The reflective structure 85 comprises metal or insulating material. For example, $SiO_2$/$TiO_2$ or $SiO_2$/$Nb_2O_5$ layers are laminated to form an insulating reflective structure with high reflectivity. When $SiO_2$/$TiO_2$ or $SiO_2$/$Nb_2O_5$ forms a Distributed Bragg Reflector (DBR) structure, each layer of the Distributed Bragg Reflector (DBR) structure is designed to comprise an optical thickness of one or an integral multiple of a quarter of the wavelength of the light emitted from the active layer 30. The optical thickness of each layer of the Distributed Bragg Reflector (DBR) structure has a deviation of ±30% on the basis of one or an integer multiple of $\lambda/4$. In another embodiment, the reflective structure 85 comprises an omnidirectional reflector (ODR) formed by an insulating layer or an insulating stack and a metal layer.

Figure 6A:
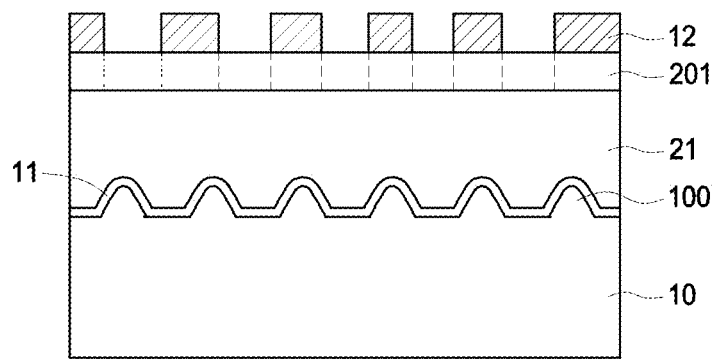
FIGS. 6A-6C illustrate a manufacturing method of the first patterned layer in accordance with an embodiment of the present application.
Figure 6B:
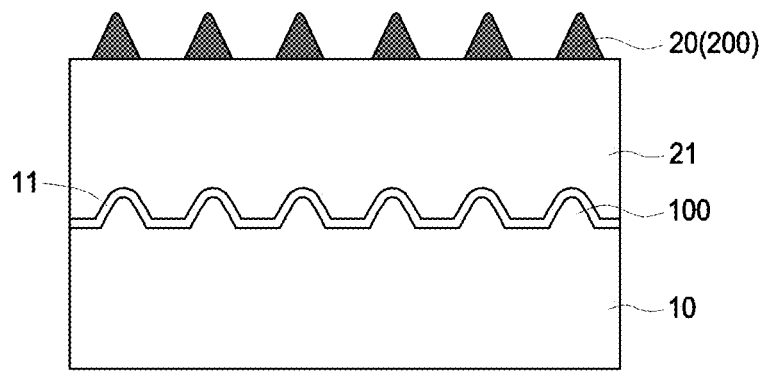

FIG. 6A and FIG. 6B illustrate a manufacturing method of the first patterned layer 20 in accordance with an embodiment of the present application. In the embodiment, the manufacturing method of the first patterned layer 20 comprises steps of forming a first material layer 201 on the first semiconductor layer 21, and patterning the first material layer 201 through a pattern mask 12 and an etching process to form the first patterned layer 20, wherein the first patterned layer 20 comprises a plurality of first convex portions 200. The first material layer 201 comprises an insulating material comprising a group V element, such as $Al_xN_y$ or $SiN_x$, or a group VI element, such as $TiO_x$, $Al_xO_y$, or $SiO_x$. The manufacturing method of the first material layer 201 comprises sputtering or evaporation. However, the present application is not limited to this.

The etching process comprises dry etching process or wet etching process. For example, the dry etching process comprises electron cyclotron resonance (ECR), inductively coupled plasma (ICP), or reactive ion etch (RIE). However, the present application is not limited to this. In addition, the wet etching process can be implemented by using sulfuric acid and/or phosphoric acid.

As shown in FIG. 1 and FIG. 6B, the first patterned layer 20 comprises an insulating material comprising a group V element, such as $Al_xN_y$ or $SiN_x$, or a group VI element, such as $TiO_x$, $Al_xO_y$, or $SiO_x$. The first patterned layer 20 comprises a plurality of first convex portions 200 formed on the first semiconductor layer 21. At least two adjacent first convex portions 200 are arranged to extend along the upper surface 10S of the substrate 10. The plurality of first convex portions 200 is arranged in a regular pattern or is irregularly arranged. From the side view of the light-emitting device 1, the plurality of first convex portions 200 comprises irregular, hemispherical, rectangular, trapezoidal, or triangular shapes, and each of the plurality of first convex portions 200 comprises a height between 0.1 µm and 10 µm, preferably between 0.5 µm and 5 µm, and more preferably between 0.6 µm and 2 µm. From the top view of the light-emitting device 1, the plurality of first convex portions 200 comprises a circle shape, a strip shape, or a polygon shape, and each of the plurality of first convex portions 200 comprises a width between 0.1 µm and 10 µm, preferably between 0.5 µm~5 µm, more preferably between 0.6 µm~2 µm. The plurality of first convex portions 200 comprises the same shape, or the plurality of first convex portions 200 comprises different sizes, such as curvature, height, width, or diameter.

In the embodiment, the plurality of first convex portions 200 is separated from each other by a first distance to expose the surface of the first semiconductor layer 21. The first distance between the plurality of first convex portions 200 is between 0.01 µm and 5 µm, preferably less than 2 µm, and more preferably less than 0.2 µm.

In an embodiment of the present application, the plurality of first convex portions 200 described above can be replaced with a plurality of first concave portions (not shown).

The light from the active layer 30 emitted toward the plurality of first convex portions 200 is reflected by the plurality of first convex portions 200, and then the light is emitted toward the direction of the first electrode 60 and the second electrode 70 to increase the light extraction efficiency of the light-emitting device 1.

Figure 2A:
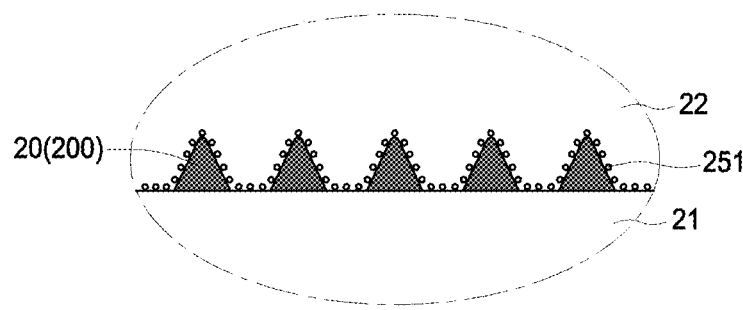
FIG. 2A illustrates a partial enlarged view of the first patterned layer illustrated in FIG. 1.
Figure 2B:
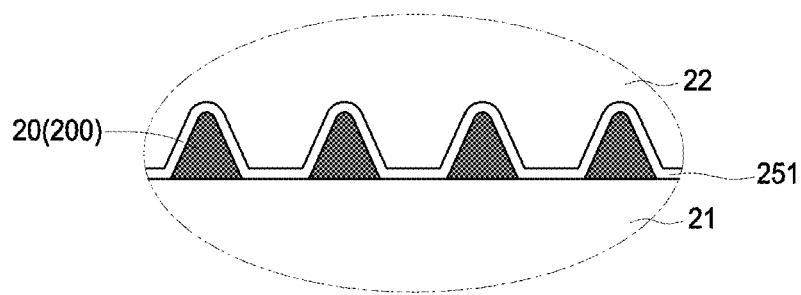
FIG. 2B illustrates a partial enlarged view of the first patterned layer illustrated in FIG. 1.

FIG. 2A illustrates a partial enlarged view of the position A disclosed in FIG. 1 in accordance with an embodiment of the present application. FIG. 2B illustrates a partial enlarged view of the position A disclosed in FIG. 1 in accordance with another embodiment of the present application. In an embodiment of the present application, the second semiconductor layer 22 comprises a core layer 251 comprising a group III or transition metal material and is formed along the first patterned layer 20. The core layer 251 can be a continuous layer as shown in FIG. 2B or a discontinuous layer as shown in FIG. 2A. In an embodiment of the application, the transition metal can be zinc (Zn), and the group III material can be aluminum (Al).

In an embodiment of the present application, when the core layer 251 comprises a group III material, the core layer 251 can be formed by introducing an organic aluminum reaction source, such as trimethylaluminum ($(CH_3)_3Al$, TMAl), to form a metal layer comprising aluminum. Then, a nitrogen source, such as $NH_3$, reacts with the core layer 251 to form the second semiconductor layer 22 comprising aluminum, such as AN. When the nitrogen source is introduced, an organic gallium reaction source, such as trimethylgallium ($(CH_3)_3Ga$, TMGa), can be selectively introduced to react with the core layer 251 to form the second semiconductor layer 22 comprising aluminum, such as AlGaN.

FIG. 2A illustrates a partial enlarged view of the position A disclosed in FIG. 1 in accordance with an embodiment of the present application. The core layer 251 can be a discontinuous layer comprising group III or transition metal materials and is formed along the first patterned layer 20.

FIG. 2B illustrates a partial enlarged view of the position A disclosed in FIG. 1 in accordance with an embodiment of the present application. In another embodiment of the present application, the core layer 251 can be a continuous layer comprising group III or transition metal materials and is formed along the first patterned layer 20. The core layer 251 comprises a thickness between 1 Å and 1000 Å, preferably between 5 Å and 500 Å, and more preferably between 10 Å and 100 Å.

The core layer 251 increases the bonding strength between different semiconductor layers. Specifically, the group III element of the core layer 251, such as aluminum, bonds with the group V element of the first semiconductor layer 21 and that of the second semiconductor layer 22, and/or with the group V element or the group VI element of the first patterned layer 20. In an embodiment, the transition metal of the core layer 251, such as zinc, bonds with the group VI element of the first patterned layer 20, such as oxygen, to form Zn—O bonding.

The second semiconductor layer 22 preferably comprises AlGaN, more preferably comprises AlGaN with a graded composition of group III element and/or group V element, which has the content of aluminum decreased in the direction away from the substrate 10, and/or the content of nitrogen increased in the direction away from the substrate 10, for example. Therefore, the X value of $Al_xGa_{(1-x)}N$ across the two sides of the second semiconductor layer 22 is preferably reduced from 0.9 to 0.1, and more preferably from 1 to 0. In an embodiment of the present application, the aluminum content can be decreased linearly, non-linearly, or stepwise. With the gradual change of the aluminum content, the lattice mismatch between the semiconductor layers is reduced.

The first semiconductor layer 21 comprises a thickness thick enough to reduce the density of lattice defects originating between the substrate 10 and the first semiconductor layer 21. The second semiconductor layer 22 comprises a thickness at least larger than the height of the first convex portion 200 so that the second semiconductor layer 22 grown on the first patterned layer 20 can be flattened. For example, the first semiconductor layer 21 comprises a thickness between 0.5 µm and 10 µm, preferably between 0.5 µm and 8 µm, and more preferably between 0.5 µm and 5 µm. The second semiconductor layer 22 comprises a thickness between 0.5 µm and 20 µm, preferably between 0.5 µm and 15 µm, and more preferably between 0.5 µm and 10 µm.

Figure 3:
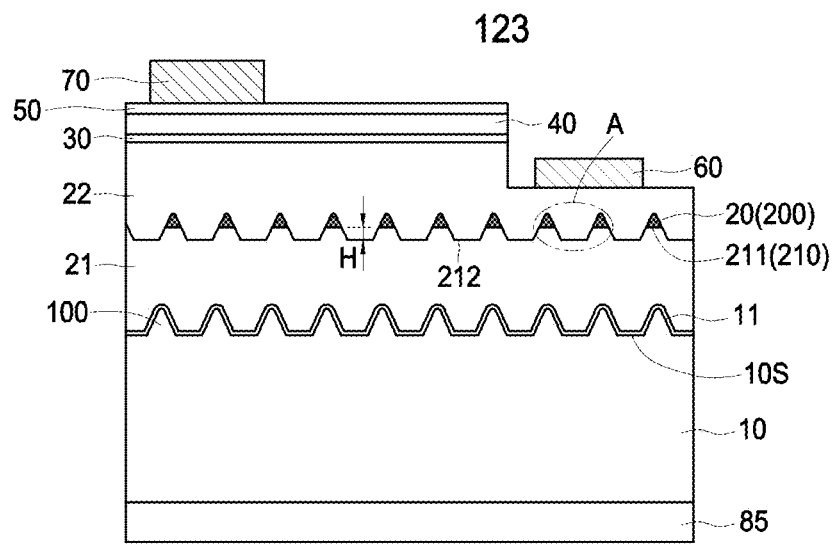
FIG. 3 illustrates a side view of a light-emitting device 2 in accordance with an embodiment of the present application.

FIG. 3 illustrates a side view of a light-emitting device 2 in accordance with another embodiment of the present application. The same symbols in FIG. 1 and FIG. 3 are used to denote the same parts, and the descriptions of the same parts are omitted here. In the embodiment, the first semiconductor layer 21 comprises a first upper surface 211 and a second upper surface 212, and a step difference H is formed between the first upper surface 211 and the second upper surface 212. The step difference H comprises a height less than 500 nm but larger than 0 nm, preferably larger than 10 nm, more preferably larger than 100 nm. The first patterned layer 20 is formed on the first upper surface 211, and the first upper surface 211 is farther from the upper surface 10S of the substrate 10 than the second upper surface 212 to the upper surface 10S of the substrate 10.

Figure 6C:
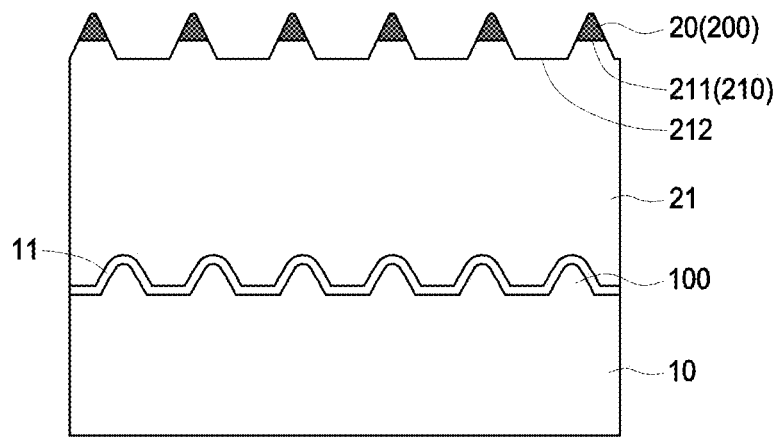

FIG. 6A and FIG. 6C illustrate a manufacturing method of the first patterned layer 20 in accordance with an embodiment of the present application. In the embodiment, the manufacturing method of the first patterned layer 20 comprises steps of forming a first material layer 201 on the first semiconductor layer 21, and patterning the first material layer 201 through a pattern mask 12 and an etching process to form a first patterned layer 20, wherein the first patterned layer 20 comprises a plurality of first convex portions 200. The first material layer 201 comprises an insulating material comprising a group V element, such as $Al_xN_y$ or $SiN_x$, or a group VI element, such as $TiO_x$, $Al_xO_y$, $SiO_x$. The manufacturing method of the first material layer 201 comprises sputtering or evaporation. However, the present application is not limited to this.

In the process of patterning the first material layer 201 to form the first patterned layer 20 by the pattern mask 12 and the etching process, a portion of the first semiconductor layer 21 is etched to form a plurality of first mesas 210 and the second upper surface 212, wherein each of the plurality of first mesas 210 comprises the first upper surface 211.

Figure 4A:
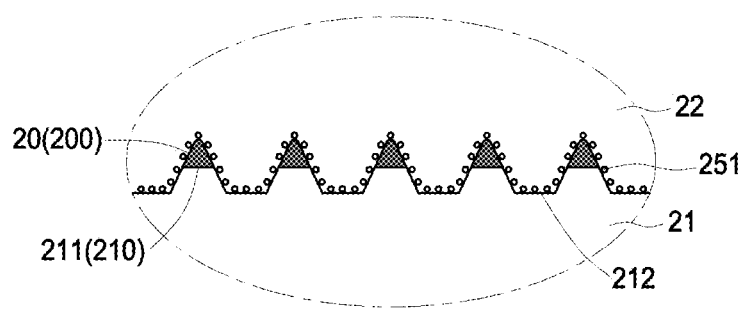
FIG. 4A illustrates a partial enlarged view of the first patterned layer illustrated in FIG. 3.

FIG. 4A illustrates a partial enlarged view of position A in FIG. 3 in accordance with an embodiment of the present application. The second semiconductor layer 22 comprises a core layer 251 comprising a group III or transition metal material, and is formed along the second upper surface 212, the plurality of first mesas 210, and the first patterned layer 20.

In an embodiment of the present application, when the core layer 251 comprises a group III material, the core layer 251 can be formed by introducing an organic aluminum reaction source, such as trimethylaluminum (($CH_3$)$_3$Al, TMAl) to form a metal layer comprising aluminum. Then, a nitrogen source, such as $NH_3$, reacts with the core layer 251 to form a second semiconductor layer 22 comprising aluminum, such as AN. When the nitrogen source is introduced, an organic gallium reaction source, such as trimethylgallium (($CH_3$)$_3$Ga, TMGa), can be selectively introduced to react with the core layer 251 to form the second semiconductor layer 22 comprising aluminum, such as AlGaN. FIG. 4A illustrates a partial enlarged view of position A in FIG. 3 in accordance with an embodiment of the present application. As shown in FIG. 4A, the core layer 251 can be a discontinuous layer comprising group III element or transition metal materials, and is formed along the second upper surface 212, the plurality of first mesas 210, and the first patterned layer 20.

Figure 4B:
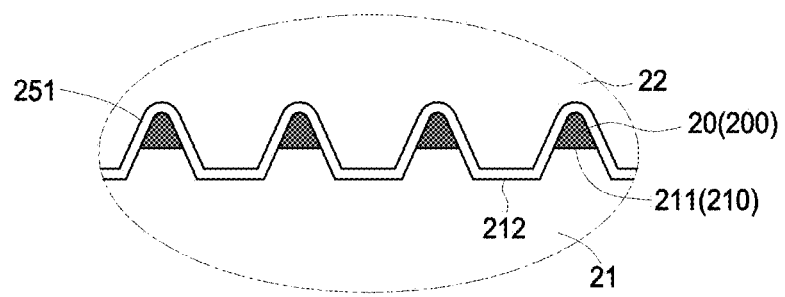
FIG. 4B illustrates a partial enlarged view of the first patterned layer illustrated in FIG. 3.

FIG. 4B illustrates a partial enlarged view of position A in FIG. 3 in accordance with another embodiment of the present application. The core layer 251 can be a continuous layer comprising a group III or transition metal material, and is formed along the second upper surface 212, the plurality of first mesas 210, and the first patterned layer 20. The core layer 251 comprises a thickness between 1 Å and 1000 Å, preferably between 5 Å and 500 Å, and more preferably between 10 Å and 100 Å.

The core layer 251 increases the bonding strength between different semiconductor layers. Specifically, the group III element of the core layer 251, such as aluminum, bonds with the group V element of the first semiconductor layer 21 and that of the second semiconductor layer 22, and/or with the group V element or group VI element of the first patterned layer 20. In an embodiment, the transition metal of the core layer 251, such as zinc, bonds with the VI group element of the first patterned layer 20, such as oxygen, to form Zn—O bonding.

Figure 5A:
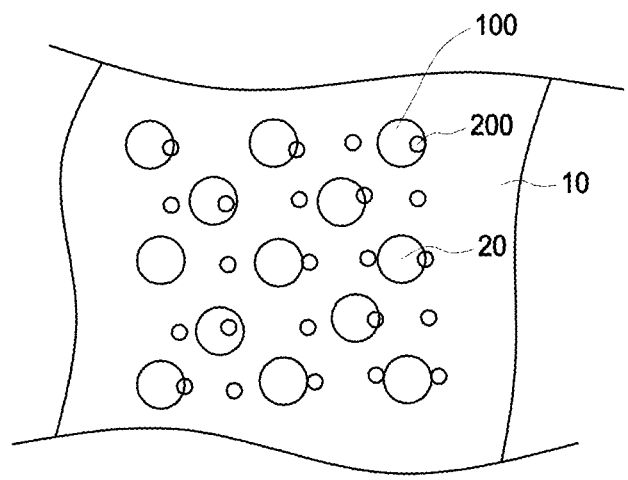
FIG. 5A illustrates a top view of the first patterned layer and the substrate in accordance with an embodiment of the present application.

FIG. 5A illustrates a top view of the first patterned layer 20 and the substrate 10 in accordance with an embodiment of the present application. As shown in FIG. 5A, the plurality of first convex portions 200 of the first patterned layer 20 partially overlaps the plurality of convex portions 100 of the substrate 10, and is partially staggered with the plurality of convex portions 100 of the substrate 10. In the embodiment, the first convex portion 200 of the first patterned layer 20 and the convex portion 100 of the substrate 10 comprise the same or different shape. The first convex portion 200 comprises a width or a diameter smaller than, equal to, or greater than a width or a diameter of the convex portion 100.

Figure 5B:
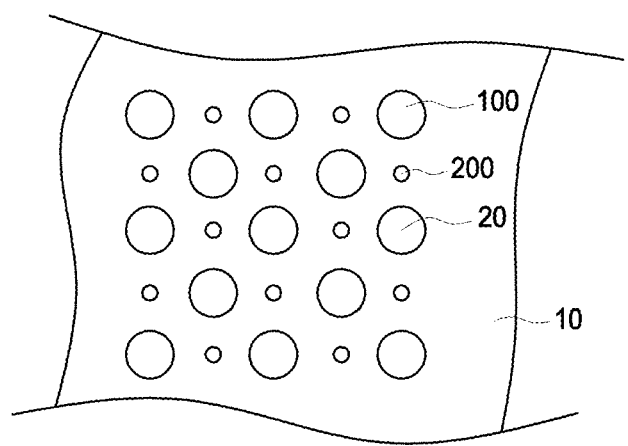
FIG. 5B illustrates a top view of the first patterned layer and the substrate in accordance with an embodiment of the present application.

FIG. 5B illustrates a top view of the first patterned layer 20 and the substrate 10 in accordance with an embodiment of the present application. As shown in FIG. 5B, the plurality of first convex portions 200 of the first patterned layer 20 and the plurality of convex portions 100 of the substrate 10 do not overlap each other. In the embodiment, the first convex portion 200 of the first patterned layer 20 and the convex portion 100 of the substrate 10 comprise the same or different shape. The first convex portion 200 comprises a width or a diameter smaller than, equal to, or greater than a width or a diameter of the convex portion 100.

Figure 5C:
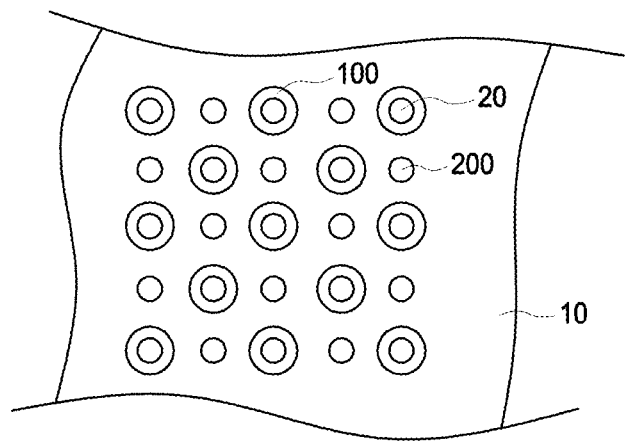
FIG. 5C illustrates a top view of the first patterned layer and the substrate in accordance with an embodiment of the present application.

FIG. 5C illustrates a top view of the first patterned layer 20 and the substrate 10 in accordance with an embodiment of the present application. As shown in FIG. 5C, the plurality of first convex portions 200 of the first patterned layer 20 corresponds to the plurality of convex portions 100 of the substrate 10 respectively. In the embodiment, the first convex portion 200 of the first patterned layer 20 and the convex portion 100 of the substrate 10 comprise the same or different shape. The first convex portion 200 comprises a width or a diameter smaller than, equal to, or greater than a width or a diameter of the convex portion 100.

Figure 7A:
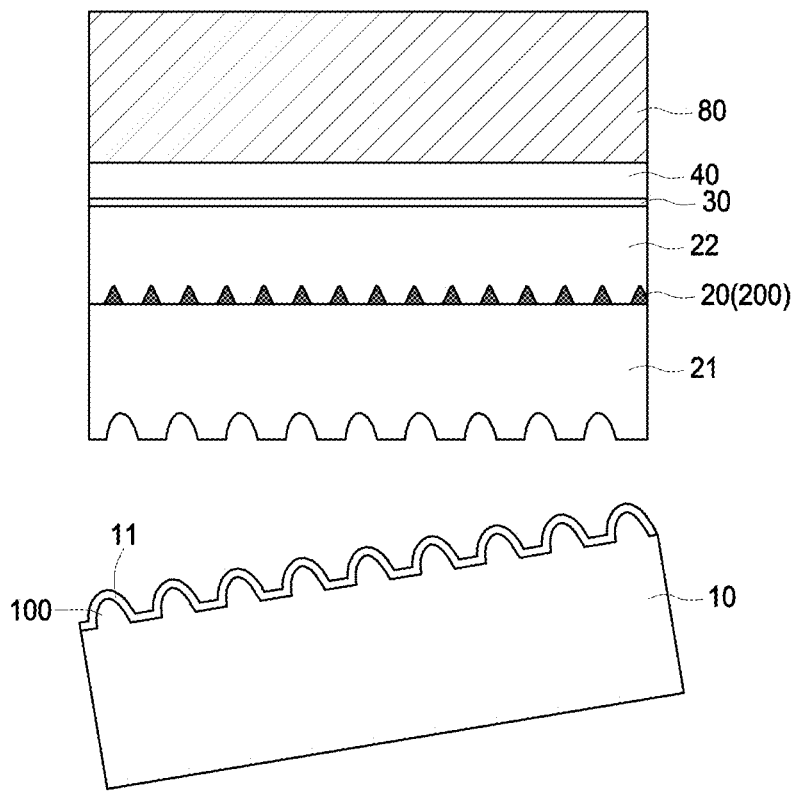
FIG. 7A illustrates a manufacturing method of the light-emitting devices 3a, 3b, and 3c in accordance with an embodiment of the present application.
Figure 7B:
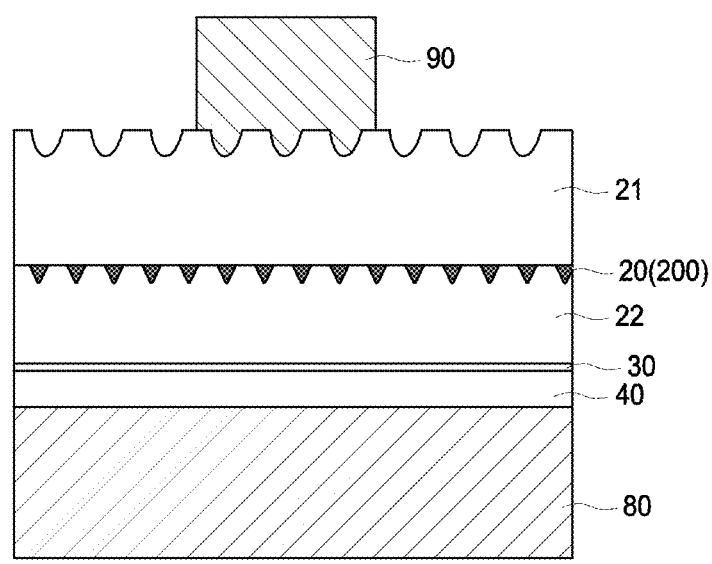
FIG. 7B illustrates a side view of the light-emitting device 3a in accordance with an embodiment of the present application.
Figure 7C:
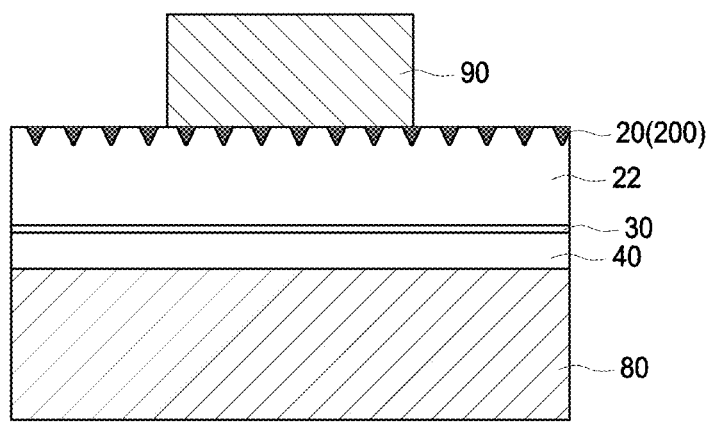
FIG. 7C illustrates a side view of the light-emitting device 3b in accordance with an embodiment of the present application.
Figure 7D:
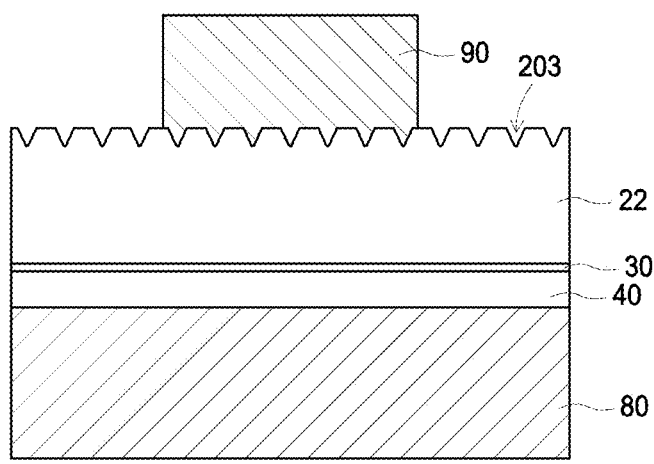
FIG. 7D illustrates a side view of the light-emitting device 3c in accordance with an embodiment of the present application.

FIG. 7A illustrates a manufacturing method of the light-emitting devices 3a, 3b, and 3c in accordance with an embodiment of the present application. FIG. 7B, FIG. 7C, and FIG. 7D illustrate side views of the light-emitting devices 3a, 3b, and 3c in accordance with an embodiment of the present application. In FIG. 1, FIG. 3, FIG. 7A, FIG. 7B, FIG. 7C, and FIG. 7D, the same symbols are used to denote the same parts, and the descriptions of the same parts are omitted here. As shown in FIG. 7A, FIG. 7B, FIG. 7C, and FIG. 7D, the manufacturing method of the light-emitting devices 3a, 3b, and 3c comprises the steps of providing a substrate 10; growing a first semiconductor layer 21 on the substrate 10; forming a first patterned layer 20 on the first semiconductor layer 21; growing a second semiconductor layer 22 on the first semiconductor layer 21; growing an active layer 30 on the second semiconductor layer 22; growing a third semiconductor layer 40 on the active layer 30; bonding the third semiconductor layer 40 to a carrier substrate 80; removing the substrate 10; and forming an electrode 90 on the first semiconductor layer 21 or the second semiconductor layer 22.

In an embodiment of the present application, as shown in FIG. 2A, the second semiconductor layer 22 comprises a core layer comprising a group III or transition metal material and formed along the first patterned layer 20, wherein the core layer 251 can be a discontinuous layer.

In another embodiment of the present application, as shown in FIG. 2B, the core layer 251 can be a continuous layer comprising group III element or transition metal materials and formed along the first patterned layer 20. The core layer 251 comprises a thickness between 1 Å and 1000 Å, preferably between 5 Å and 500 Å, and more preferably between 10 Å and 100 Å.

In another embodiment of the present application, as shown in FIG. 4A, the first semiconductor layer 21 comprises a plurality of first mesas 210 and a second upper surface 212, wherein each of the plurality of first mesas 210 comprises a first upper surface 211. A core layer 251 comprising a group III or transition metal material is formed along the second upper surface 212, a plurality of first mesas 210, and the first patterned layer 20. The core layer 251 can be a discontinuous layer.

In another embodiment of the present application, as shown in FIG. 4B, the first semiconductor layer 21 comprises a plurality of first mesas 210 and a second upper surface 212, wherein each of the plurality of first mesas 210 comprises a first upper surface 211. The core layer 251 can be a continuous layer comprising a group III or transition metal material, and is formed along the second upper surface 212, the plurality of first mesas 210, and the first patterned layer 20. The core layer 251 comprises a thickness between 1 Å and 1000 Å, preferably between 5 Å and 500 Å, and more preferably between 10 Å and 100 Å.

The application uses a physical or chemical process to remove the substrate 10 and recycle the substrate 10. In addition to avoiding arbitrarily discarding of the sapphire substrate comprising gallium which causes harm to the human body and the environment, it can also achieve the effect of perpetual circulation of the valuable resources.

The method of removing the substrate 10 comprises laser lift-off, which uses the high energy laser to irradiate on the interface between the sapphire substrate and the GaN layer. The high temperature of the laser decomposes the GaN layer to form liquid metal Ga and gaseous N.

The method of removing the substrate 10 can also be achieved by chemical wet etching. The chemical wet etching comprises a chemical solution that reacts with group III nitride. When the chemical solution penetrates into the interface between the group III nitride and the sapphire substrate, the sapphire substrate and the semiconductor layer are separated.

FIG. 7B illustrates a side view of a light-emitting device 3a in accordance with an embodiment of the present application. The same symbols in FIG. 1, FIG. 3, FIG. 7A, and FIG. 7B are used to denote the same parts, and the descriptions of the same parts are omitted here. As shown in FIG. 7B, after the substrate 10 is removed from the first semiconductor layer 21, an electrode 90 is formed on the first semiconductor layer 21. In the embodiment, the first semiconductor layer 21 comprises a doped semiconductor layer.

FIG. 7C illustrates a side view of a light-emitting device 3b in accordance with an embodiment of the present application. The same symbols in FIG. 1, FIG. 3, FIG. 7A, and FIG. 7C are used to denote the same parts, and the descriptions of the same parts are omitted here. As shown in FIG. 7C, following the manufacturing method of FIG. 7A, the first semiconductor layer 21 is further removed, and an electrode 90 is formed on the second semiconductor layer 22. In the embodiment, the first semiconductor layer 21 comprises a doped or an undoped semiconductor layer. The second semiconductor layer 22 can be a semiconductor comprising n-type conductivity.

FIG. 7D illustrates a side view of a light-emitting device 3c in accordance with an embodiment of the present application. The same symbols in FIG. 1, FIG. 3, FIG. 7A, and FIG. 7D are used to denote the same parts, and the descriptions of the same parts are omitted here. As shown in FIG. 7D, following the manufacturing method of FIG. 7A, the first semiconductor layer 21 and the first patterned layer 20 are further removed, and an electrode 90 is formed on the second semiconductor layer 22. In the embodiment, after the first patterned layer 20 is removed, a surface of the second semiconductor layer 22 comprises a plurality of concave portions 203. The second semiconductor layer 22 can be a semiconductor comprising n-type conductivity.

Figure 8A:
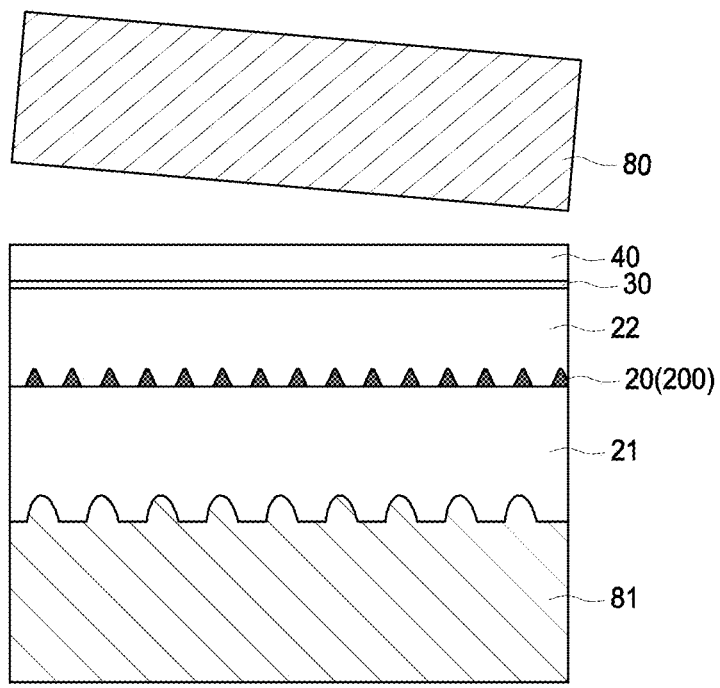
FIG. 8A illustrates a manufacturing method of a light-emitting device 4 in accordance with an embodiment of the present application.
Figure 8B:
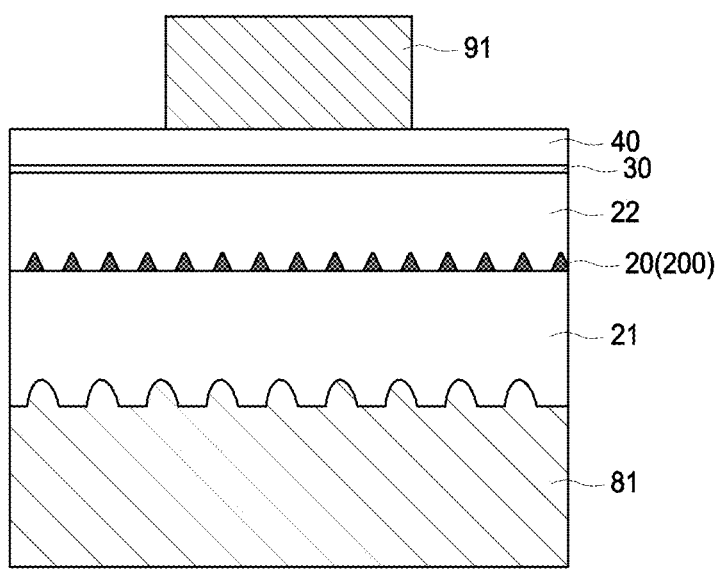
FIG. 8B illustrates a side view of the light-emitting device 4 in accordance with an embodiment of the present application.

FIG. 8A illustrates a manufacturing method of a light-emitting device 4 in accordance with an embodiment of the present application. FIG. 8B illustrates a side view of the light-emitting device 4 in accordance with an embodiment of the present application. Following the manufacturing method of FIG. 7A, as shown in FIG. 7A and FIG. 8A, the manufacturing method of the light-emitting device 4 comprises steps of providing a substrate 10; growing a first semiconductor layer 21 on the substrate 10; forming a first patterned layer 20 on the first semiconductor layer 21; growing a second semiconductor layer 22 on the first semiconductor layer 21; growing an active layer 30 on the second semiconductor layer 22; growing a third semiconductor layer 40 on the active layer 30; bonding the third semiconductor layer 40 to a carrier substrate 80; removing the substrate 10; attaching a permanent substrate 81 to the first semiconductor layer 21; and removing the carrier substrate 80.

FIG. 8B illustrates a side view of a light-emitting device 4 in accordance with an embodiment of the present application. The same symbols in FIG. 1, FIG. 3, FIG. 7A, FIG. 8A, and FIG. 8B are used to denote the same parts, and the descriptions of the same parts are omitted here. As shown in FIG. 8B, after the carrier substrate 80 is removed, an electrode 91 is formed on the third semiconductor layer 40. In the embodiment, the first semiconductor layer 21 comprises a doped semiconductor layer, the second semiconductor layer 22 can be a semiconductor comprising n-type conductivity, and the third semiconductor layer 40 can be a semiconductor comprising p-type conductivity.

In the embodiment of the present application, following the step of FIG. 7A, before attaching the permanent substrate 81 to the first semiconductor layer 21, the uneven surface of the first semiconductor layer 21 can be flattened by etching or grinding, and then the permanent substrate 81 and the first semiconductor layer 21 are bonded. However, the application is not limited to this. In an embodiment of the present application, before attaching the permanent substrate 81 to the first semiconductor layer 21, an adhesive layer (not shown) is formed on the uneven surface of the first semiconductor layer 21, and then the first semiconductor layer 21 and the permanent substrate 81 are bonded through the adhesive layer. In another embodiment of the present application, the permanent substrate 81 can be formed on the uneven surface of the first semiconductor layer 21 by electroplating.

The carrier substrate 80 and the permanent substrate 81 comprise metal materials, such as molybdenum or tungsten, or semiconductor materials, such as germanium or silicon. An adhesive layer (not shown) is used to bond the third semiconductor layer 40 and the carrier substrate 80 or the first semiconductor layer 21 and the permanent substrate 81, and provides a good conductive path. The material of the adhesive layer (not shown) comprises gold, tin, lead, indium, or an alloy of the above materials.

In another embodiment of the present application, a light emitting device (not shown) comprises a first semiconductor layer 21, a first patterned layer 20, a second semiconductor layer 22, an active layer 30, a third semiconductor layer 40, and two electrodes respectively formed on the first semiconductor layer 21 and the third semiconductor layer 40. The light-emitting device does not comprise the substrate 10 or other carrier substrates, but is attached to a temporary support structure, such as a blue film. In the embodiment, the light-emitting device comprises a micro LED, wherein the length of either side is more than 2 μm, preferably more than 5 μm, more preferably more than 10 μm, but less than 80 μm, preferably less than 40 μm, more preferably less than 20 μm.

The electrode 90, 91 comprises metal materials, such as chromium (Cr), titanium (Ti), tungsten (W), gold (Au), aluminum (Al), indium (In), tin (Sn), nickel (Ni), platinum (Pt), or an alloy of the above materials. The electrode 90, 91 comprises single layer or multiple layers. For example, the electrode 90, 91 comprises Ti/Au layers, Ti/Pt/Au layers, Cr/Au layers, Cr/Pt/Au layers, Ni/Au layers, Ni/Pt/Au layers, or Cr/Al/Cr/Ni/Au layers. The electrode 90, 91 can be used as a current path for the external power supply to supply power to the light-emitting device. The electrode 90, 91 comprises a thickness between 1~100 μm, preferably between 1.2~60 μm, more preferably between 1.5~6 μm.

Figure 9:
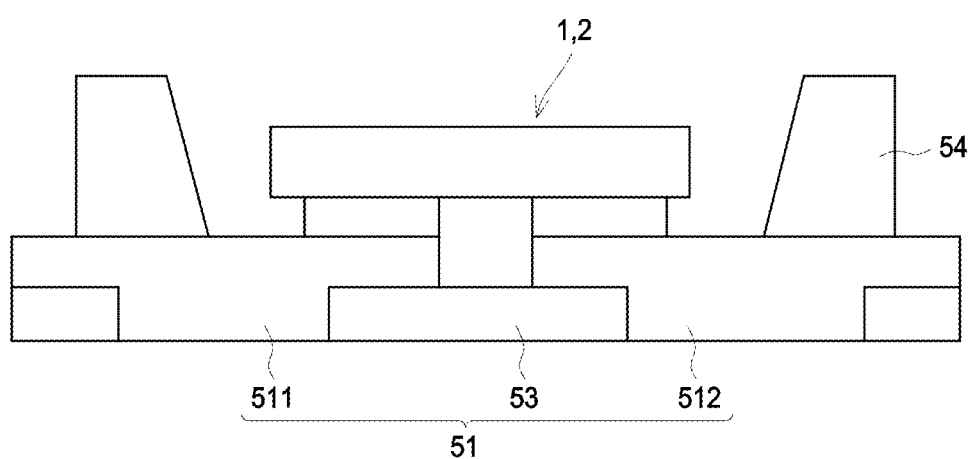
FIG. 9 illustrates a schematic diagram of a light-emitting apparatus 5 in accordance with an embodiment of the present application.

FIG. 9 illustrates a schematic view of a light-emitting apparatus 5 in accordance with an embodiment of the present application. The light-emitting device 1 or 2 described in the foregoing embodiments is mounted on the first spacer 511 and the second spacer 512 of the package substrate 51 in the form of flip chip. The first spacer 511 and the second spacer 512 are electrically insulated from each other by an insulating portion 53 comprising an insulating material. The main light-extraction surface of the flip chip is one side of the growth substrate opposite to the electrode forming surface where the electrodes are formed on. A reflective structure 54 can be provided around the light-emitting device 1 or 2 to increase the light extraction efficiency of the light-emitting apparatus 5.

Figure 10:
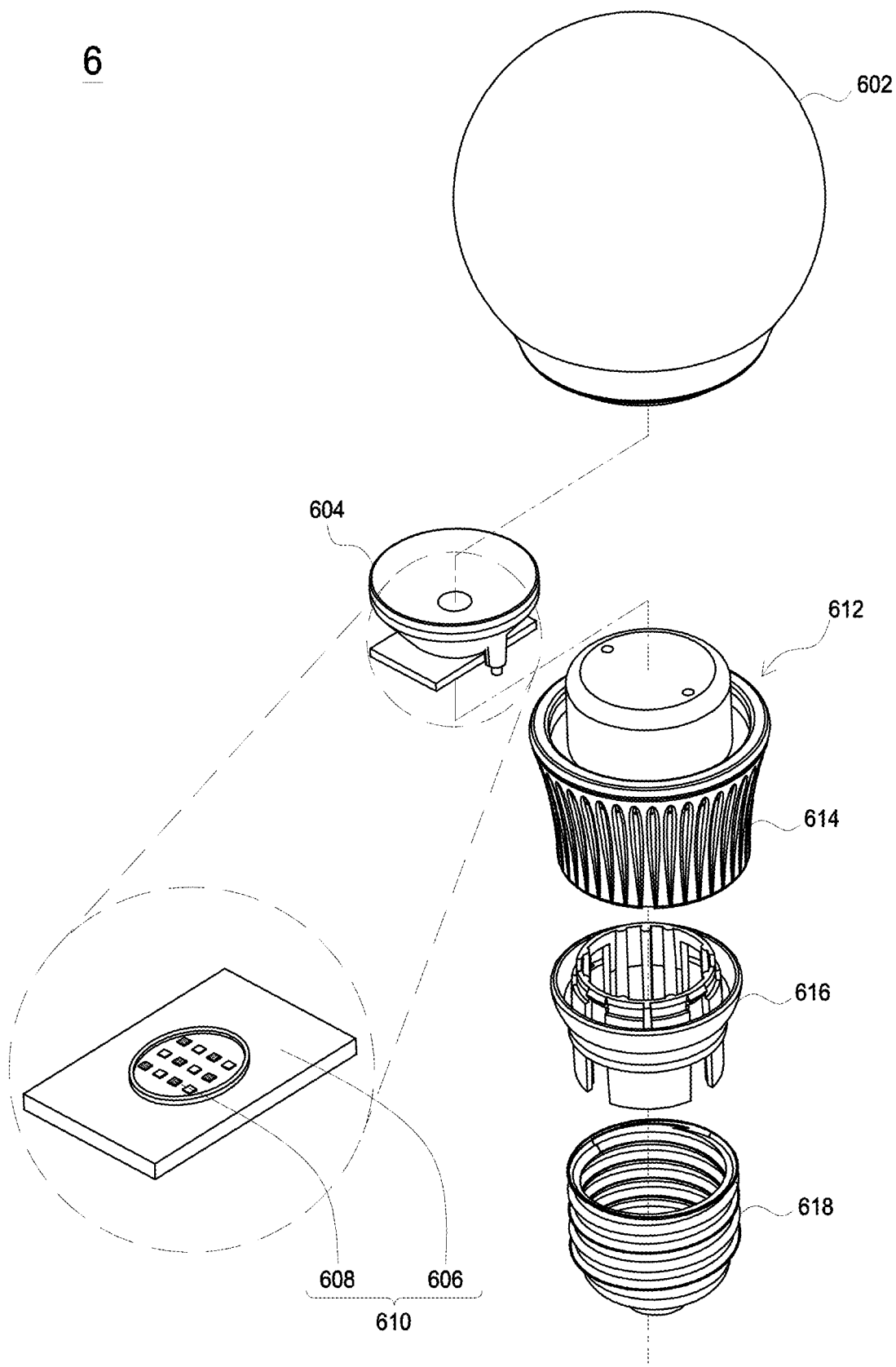
FIG. 10 illustrates a schematic diagram of a light bulb 6 in accordance with an embodiment of the present application.

FIG. 10 illustrates a schematic diagram of a light bulb 6 in accordance with an embodiment of the present application. The light bulb 6 comprises an envelope 602, a lens 604, a light-emitting module 610, a base 612, a heat sink 614, a connector 616, and an electrical connecting device 618. The light-emitting module 610 comprises a submount 606 and a plurality of light-emitting devices 608 on the submount 606, wherein the plurality of light-emitting devices 608 can be the light-emitting device 1, 2, 3a-3c, or 4 or the light-emitting apparatus 5 described in above embodiments.

Figure 11:
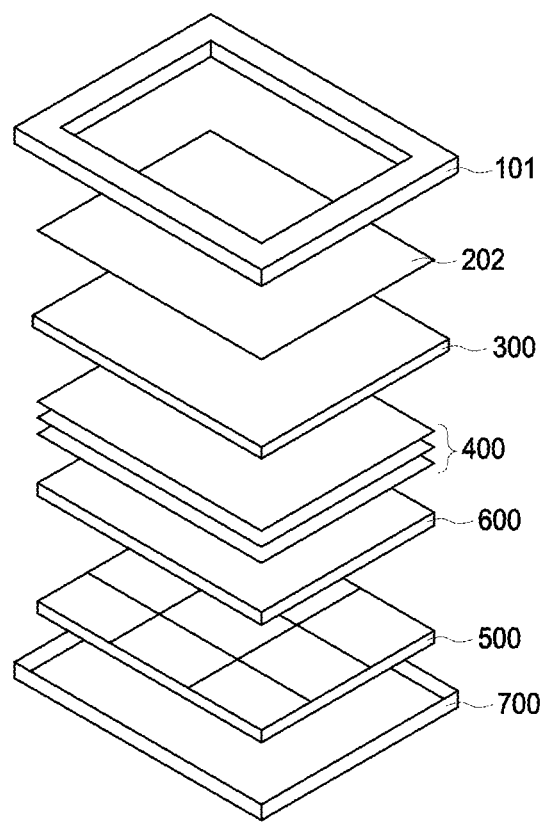
FIG. 11 illustrates a schematic diagram of a backlight module 7 in accordance with an embodiment of the present application.

FIG. 11 illustrates a schematic diagram of a backlight module 7 in accordance with an embodiment of the present application. The backlight module 7 comprises a first frame 101; a liquid crystal display 202; a brightness enhancement film 300; an optical module 400; a light-emitting module assembly 500; and a second frame 700, wherein the light-emitting module assembly 500 comprises a plurality of the above-mentioned light-emitting devices 1, 2, 3a-3c, or 4 or light-emitting apparatus 5, which are arranged on the light-emitting module assembly 500 in an edge type or direct type light emitting manner. In another embodiment of the present application, the backlight module 7 further comprises a wavelength conversion structure 600 formed on the light-emitting module assembly 500. In another embodiment of the present application, the above-mentioned light-emitting device 1, 2, 3a~3c, or 4 comprises a sub-millimeter light-emitting diode (mini LED) or a micro LED.

Figure 12:
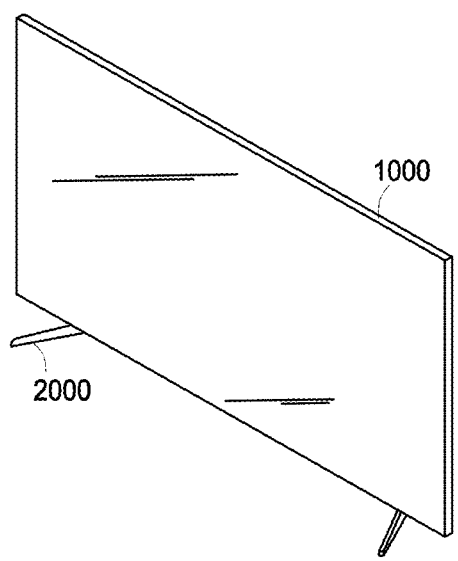
FIG. 12 illustrates a schematic diagram of a display 8 in accordance with an embodiment of the present application.

FIG. 12 illustrates a schematic diagram of a display 8 in accordance with an embodiment of the present application. The display 8 comprises a LED light-emitting panel 1000; a current source (not shown); a bracket 2000 to support the LED light-emitting panel 1000, wherein the LED light-emitting panel 1000 comprises a plurality of the above-mentioned light-emitting devices 1, 2, 3a~3c, or 4 or the light-emitting apparatus 5. The LED light-emitting panel 1000 comprises a plurality of pixel units (pixel), each pixel unit comprises a plurality of light-emitting devices or light-emitting apparatuses emitting different colors, for example, each pixel unit comprises three light emitting devices emitting red, green, and blue light respectively. In another embodiment of the application, the above-mentioned light-emitting device comprises a sub-millimeter light-emitting diode (mini LED) or a micro LED.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. A light-emitting device, comprising:
   a substrate;
   a first semiconductor layer formed on the substrate, wherein the first semiconductor layer comprises a plurality of first mesas protruding from the first semiconductor layer, and wherein the first semiconductor layer further comprises a first upper surface and a second upper surface, and the first upper surface is formed on the plurality of first mesas;
   a first patterned layer formed on the plurality of first mesas of the first semiconductor layer; and
   a second semiconductor layer formed on the first semiconductor layer, wherein the second semiconductor layer comprises a core layer comprising a group III element or a transition metal material formed along the first patterned layer.

2. The light-emitting device according to claim 1, wherein the core layer is a discontinuous layer.

3. The light-emitting device according to claim 1, wherein the core layer is a continuous layer.

4. The light-emitting device according to claim 3, wherein the core layer comprises a thickness between 1 Å and 1000 Å.

5. The light-emitting device according to claim 1, wherein the first semiconductor layer and the second semiconductor layer comprise a first conductivity type dopant.

6. The light-emitting device according to claim 1, wherein the first semiconductor layer is undoped and the second semiconductor layer comprise a first conductivity type dopant.

7. The light-emitting device according to claim 1, further comprising an active layer and a third semiconductor layer comprising a second conductivity type dopant formed on the active layer.

8. The light-emitting device according to claim 1, wherein the first patterned layer comprises an insulating material.

9. The light-emitting device according to claim 8, wherein the insulating material comprises $TiO_x$, $Al_xN_y$, $Al_xO_y$, $SiO_x$, or $SiN_x$.

10. The light-emitting device according to claim 1, wherein the first semiconductor layer and the second semiconductor layer comprise nitrogen.

11. The light-emitting device according to claim 1, wherein a step difference is formed between the first upper surface and the second upper surface.

12. The light-emitting device according to claim 1, wherein the first patterned layer is formed on the first upper surface, and the core layer is formed on the first patterned layer, the plurality of first mesas, and the second upper surface.

13. The light-emitting device according to claim 11 wherein the step difference comprises a height less than 500 nm.

14. The light-emitting device according to claim 1, wherein the first patterned layer comprises a plurality of first convex portions comprising a width between 0.6 μm~2 μm.

15. The light-emitting device according to claim 14, wherein the substrate comprises a plurality of convex portions, and the plurality of convex portions and the plurality of first convex portions comprise same shape.

16. The light-emitting device according to claim 1, wherein the second semiconductor layer comprises an aluminum content equal to that of the first semiconductor layer.

17. The light-emitting device according to claim 1, wherein the second semiconductor layer comprises an aluminum content greater than that of the first semiconductor layer.

18. The light-emitting device according to claim 1, wherein the second semiconductor layer comprises an aluminum content less than that of the first semiconductor layer.

* * * * *